United States Patent
Park et al.

(10) Patent No.: US 9,685,636 B2
(45) Date of Patent: Jun. 20, 2017

(54) COMPOSITE SHEET AND DISPLAY DEVICE COMPRISING THE SAME

(71) Applicant: Samsung Display Co., Ltd., Yongin (KR)

(72) Inventors: Kyung Jun Park, Yongin-si (KR); Hwan Jin Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 205 days.

(21) Appl. No.: 14/589,709

(22) Filed: Jan. 5, 2015

(65) Prior Publication Data

US 2016/0027718 A1 Jan. 28, 2016

(30) Foreign Application Priority Data

Jul. 23, 2014 (KR) ........................ 10-2014-0093264

(51) Int. Cl.
  *H01L 51/52* (2006.01)
  *G02F 1/1333* (2006.01)

(52) U.S. Cl.
  CPC ...... *H01L 51/529* (2013.01); *G02F 1/133385* (2013.01); *H01L 51/5237* (2013.01); *G02F 2001/133314* (2013.01)

(58) Field of Classification Search
  CPC .............. H01L 51/529; H01L 51/5237; G02F 1/133385; G02F 2001/133314
  USPC ................................................. 361/688–723
  See application file for complete search history.

(56) References Cited

U.S. PATENT DOCUMENTS

| | | | |
|---|---|---|---|
| 2005/0052358 A1* | 3/2005 | Cho ................... | H05K 7/20963 345/60 |
| 2005/0266231 A1* | 12/2005 | Lin ................... | G02F 1/133385 428/317.9 |
| 2006/0126304 A1* | 6/2006 | Smalc ................. | G06F 1/203 361/704 |
| 2006/0133046 A1* | 6/2006 | Kim ................... | H05K 7/20963 361/714 |
| 2006/0133049 A1* | 6/2006 | Hagiwara ........... | H01L 23/4338 361/720 |
| 2010/0009174 A1* | 1/2010 | Reis ......................... | B32B 3/26 428/332 |
| 2011/0304792 A1* | 12/2011 | Lee ................... | G02F 1/133608 349/58 |
| 2013/0050953 A1* | 2/2013 | Sano ................... | H04M 1/0202 361/720 |
| 2015/0083371 A1* | 3/2015 | Hsieh ....................... | G06F 1/20 165/104.26 |

(Continued)

FOREIGN PATENT DOCUMENTS

| | | |
|---|---|---|
| KR | 10-2007-0034157 | 3/2007 |
| KR | 10-0736467 | 7/2007 |

(Continued)

*Primary Examiner* — Anthony Haughton
*Assistant Examiner* — Yahya Ahmad
(74) *Attorney, Agent, or Firm* — H.C. Park & Associates, PLC

(57) ABSTRACT

A display device including: a display panel; a bottom cover configured to accommodate the display panel; and a composite sheet disposed between the display panel and the bottom cover. The composite sheet includes a buffer sheet having at least one through hole and at least one heat-dissipating sheet accommodated in the through hole.

17 Claims, 10 Drawing Sheets

(56) References Cited

U.S. PATENT DOCUMENTS

2016/0055793 A1\* 2/2016 Jang .................... G09G 3/3208
345/76

FOREIGN PATENT DOCUMENTS

| KR | 10-0896317 | 5/2009 |
|---|---|---|
| KR | 10-2013-0127176 | 11/2013 |

\* cited by examiner

COMPOSITE SHEET AND DISPLAY DEVICE COMPRISING THE SAME

CROSS-REFERENCE TO RELATED APPLICATION

This application claims priority to Korean Patent Application No. 10-2014-0093264 filed on Jul. 23, 2014, in the Korean Intellectual Property Office, the disclosure of which is incorporated herein by reference in its entirety.

BACKGROUND

Field

The invention relates to a composite sheet and a display device comprising the same.

Discussion of the Background

In accordance with the progress and maturation of modern information society, there have increasingly been demands for display devices for displaying images, and various flat panel display devices such as a liquid crystal display (LCD) device, a plasma display panel (PDP) display device, or an organic light-emitting diode (OLED) display device have been widely used.

Each flat panel display device includes a driving circuit board and a display panel, which, however, may serve as heating elements, and may thus be equipped with a heat dissipating sheet for proper heat dissipation.

Flat panel display devices have recently become smaller, lighter and thinner. However, the miniaturization of flat panel display devices is not necessarily in proportion to robustness against external shock. Accordingly, flat panel display devices may be equipped with a buffer sheet for providing mechanical rigidity and robustness against external shock.

However, the presence of a stack of a heat dissipating sheet and a buffer sheet may increase the thickness of a flat panel display device.

SUMMARY

Exemplary embodiments of the invention provide a composite sheet capable of maintaining, or even improving, heat dissipation and buffer functions in accordance with the miniaturization of flat panel display devices, and a display device comprising the composite sheet.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, there may be provided a display device, comprising: a display panel; a bottom cover configured to accommodate the display panel therein; and a composite sheet interposed between the display panel and the bottom cover and including a buffer sheet having at least one through hole and at least one heat-dissipating sheet accommodated in the through hole.

According to another exemplary embodiment of the invention, there may be provided a composite sheet, comprising: a plurality of elastic members configured to be isolated from one another; and a plurality of heat-dissipating members configured to be provided between the elastic members.

According to another exemplary embodiment of the invention, there may be provided a composite sheet, comprising: a buffer sheet configured to have at least groove formed thereon; and at least one heat-dissipating sheet configured to be inserted, and mounted, in the groove.

According to the exemplary embodiments, one or more through holes or grooves are formed on a buffer sheet, and one or more heat-dissipating sheets are embedded in the through holes or the grooves. Accordingly, it is possible to provide a slim composite sheet as compared to a related-art composite sheet having a simple stack of a heat-dissipating sheet and a buffer sheet. Therefore, it is possible to provide a display device that can be easily miniaturized, as compared to a display device having a related-art composite sheet.

In addition, air layers, which are provided in the through holes, not only can provide a buffer against external shock, but also can allow heat to be dissipated mainly through the heat-dissipating sheets and a metal sheet. Accordingly, the performance of heat dissipation can be improved. Therefore, it is possible to provide a display device with improved heat-dissipating properties, as compared to a display device having a related-art composite sheet.

Other features and exemplary embodiments will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
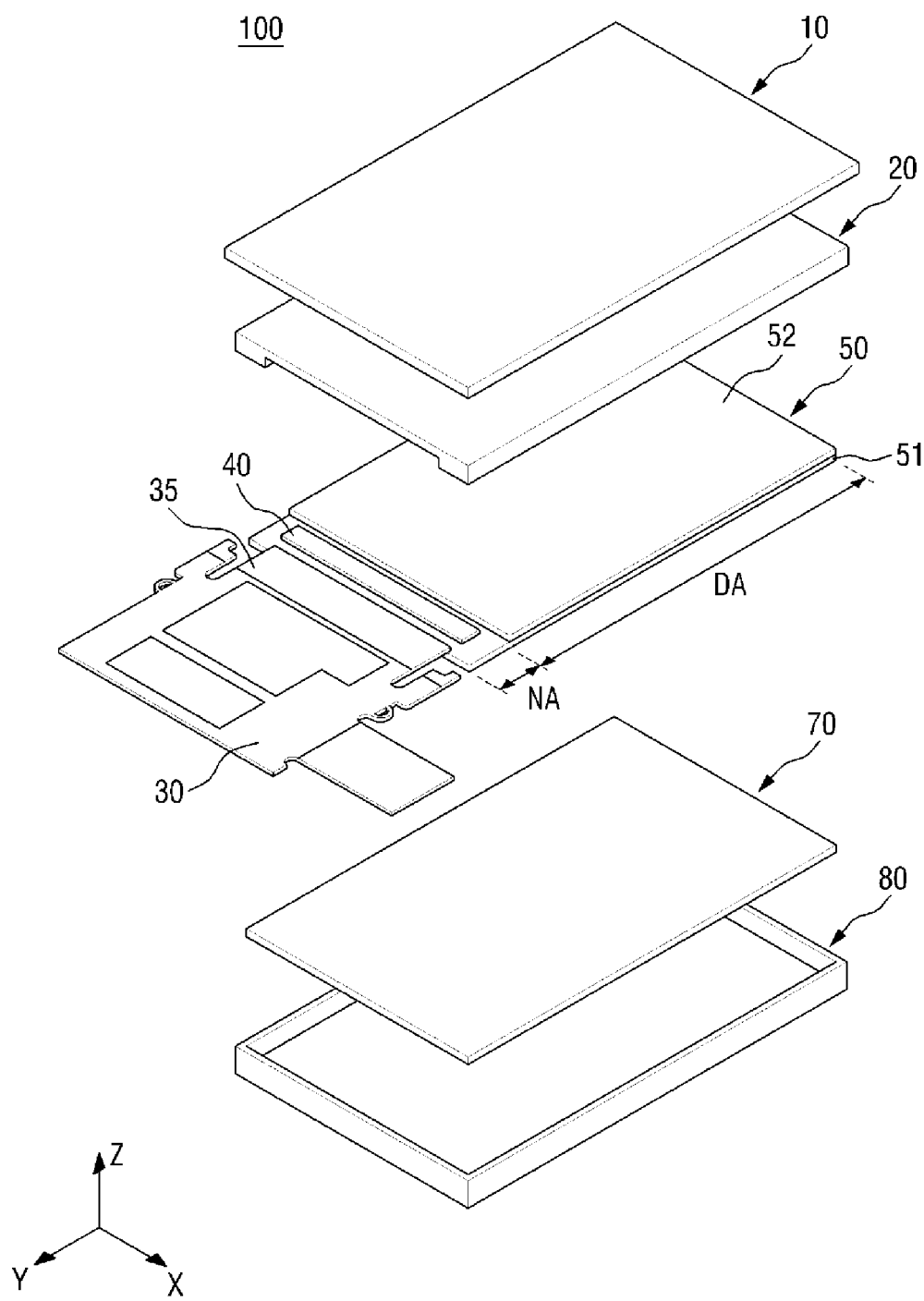
FIG. 1 is an exploded perspective view of an organic-light emitting diode (OLED) display device according to a first exemplary embodiment of the invention.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

In the drawings, the thickness of layers and regions are exaggerated for clarity. As used herein, the term "and/or" includes any and all combinations of one or more of the associated listed items.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Exemplary embodiments will hereinafter be described with reference to the accompanying drawings.

The term "display device", as used herein, may indicate a flat panel display device such as a liquid crystal display (LCD) device, a plasma display panel (PDP) display device or an organic light-emitting diode (OLED) display device.

The invention will hereinafter be described, taking an OLED display device as an example.

Figure 2:
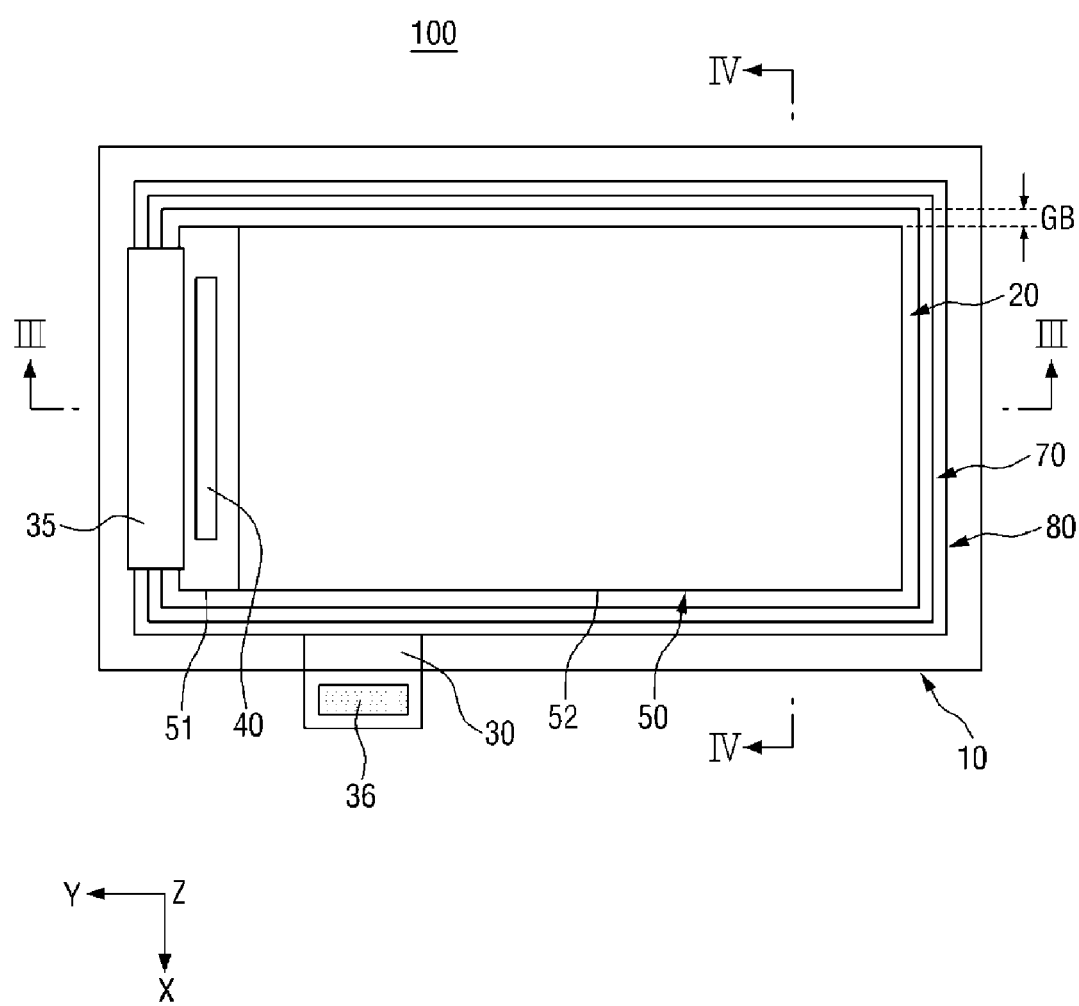
FIG. 2 is an assembled plan view of the OLED display device illustrated in FIG. 1.
Figure 3:
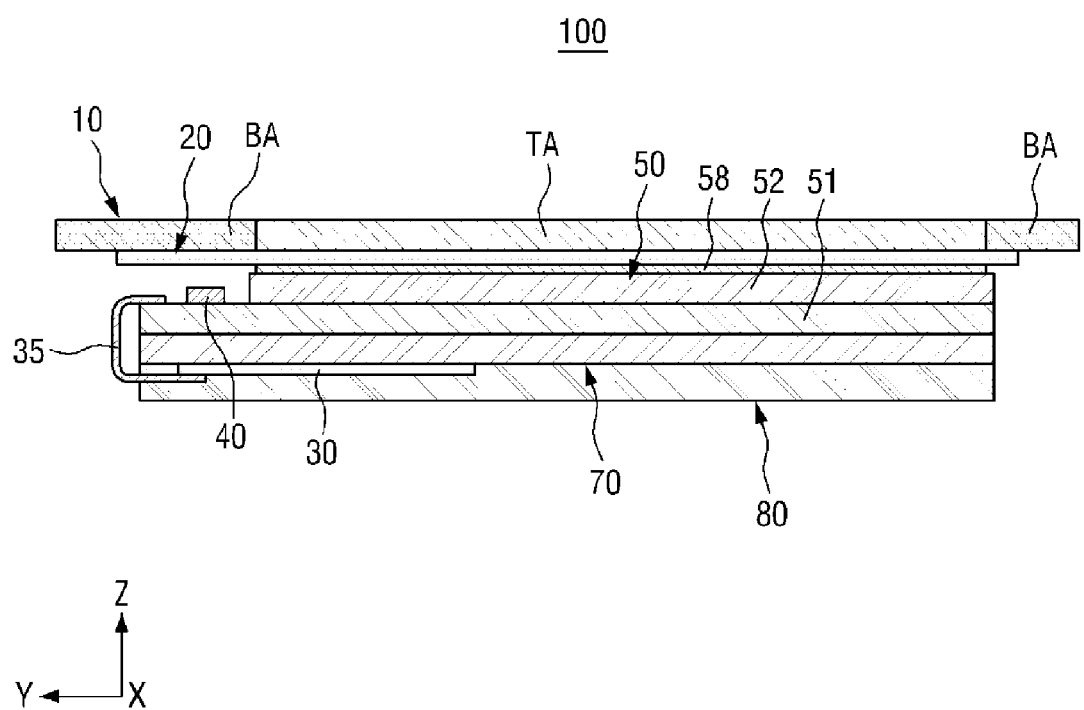
FIG. 3 is a cross-sectional view taken along line III-III' of FIG. 2.

FIG. 1 is an exploded perspective view of an OLED display device according to a first exemplary embodiment of the invention. FIG. 2 is an assembled plan view of the OLED display device illustrated in FIG. 1. FIG. 3 is a cross-sectional view taken along line III-III' of FIG. 2.

Referring to FIGS. 1 to 3, an OLED display device 100 may include a cover window 10, an adhesive layer 20, a display panel assembly 50, a composite sheet 70 and a bottom cover 80. The display panel assembly 50 may include a first substrate 51, a second substrate 52 and an integrated circuit (IC) chip 40. The OLED display device 100 may also include a driving circuit board 30 and a flexible printed circuit board (FPCB) 35.

The cover window 10 may be disposed to face the second substrate 52 and the IC chip 40, and may cover the entire display panel assembly 50. More specifically, the cover window 10 may cover a surface of the display panel assembly 50 where an image is displayed. The cover window 10 may be formed of a transparent material, such as glass or plastic.

As illustrated in FIG. 3, the cover window 10 may include a light-blocking area BA, which corresponds to the edges of the display panel assembly 50 having a mounting area NA of the first substrate 51, and a light-transmitting area TA, which corresponds to a central part of the display panel assembly 50. That is, the light-blocking area BA may correspond to the edges of a display area DA and also to the mounting area, and the light-transmitting area TA may correspond to the central part of the display area DA. The light-blocking area BA may block the transmission of unnecessary light, and may cover part of the display panel assembly 50 where no image is displayed.

The adhesive layer 20 may fill the gap between the display panel assembly 50 and the cover window 10. More specifically, the adhesive layer 20 may fill the gap between the display panel assembly 50 and the cover window 10 and may thus couple the cover window 10 and the display panel assembly 50 together.

The adhesive layer 20 may be formed to have as similar a refractive index as possible to that of the cover window 10 to minimize the reflection of light that may be caused by a difference in refractive index. The adhesive layer 20 may be formed of a material including an acryl-based resin that is curable by ultraviolet (UV) light or heat. Since the refractive index of the acryl-based resin is closer to the refractive index of the cover window 10 than to the refractive index of the air, the adhesive layer 20 may effectively reduce the reflection of light that may be caused by a difference in refractive index, by filling the gap between the second substrate 52 and the cover window 10.

The adhesive layer 20 may be formed to have higher elasticity than the cover window 10 and the bottom cover 80. The adhesive layer 20 not only can prevent the display panel assembly 50 and the cover window 10 from being peeled off from each other, but also can protect the display panel assembly 50 due to its excellent elasticity. Accordingly, the adhesive layer 20 can improve the mechanical stability and reliability of the OLED display device 100. That is, the adhesive layer 20 can protect the display panel assembly 50 from external shock.

Also, the adhesive layer 20 can prevent moisture from infiltrating into the display panel assembly 50 and can thus improve the environmental stability and reliability of the OLED display device 100.

The driving circuit board 30 may include electronic elements (not illustrated) for processing driving signals and a connector 36 for receiving external signals. The FPCB 35 may be connected to the mounting area NA of the first substrate 51 at one side thereof, and may be connected to the driving circuit board 30 at the other side thereof.

That is, the FPCB 35 may electrically connect the driving circuit board 30 and the display panel assembly 50. Accordingly, driving signals generated by the driving circuit board 30 may be transmitted to the IC chip 40 or a driver (not illustrated) on the first substrate 51 via the FPCB 35. As illustrated in FIG. 3, the FPCB 35 may be bent, and the driving circuit board 30 may be disposed on a rear surface of the composite sheet 70.

The display panel assembly 50 may include the first substrate 51, the second substrate 52 and the IC chip 40.

The first substrate 51 may include the display area DA and the mounting area NA. The second substrate 52 may be smaller in size than the first substrate 51, and may be attached onto the display area DA of the first substrate 51. The first substrate 51 and the second substrate 52 may be bonded together by a sealant provided along the edges of the second substrate 52.

The IC chip 40 may be mounted in the mounting area NA of the first substrate 51. More specifically, the IC chip 40 may be mounted in the mounting area NA of the first substrate 51 in a chip-on-glass (COG) manner. The second substrate 52 and the IC chip 40 may be disposed adjacent to each other.

Figure 4:
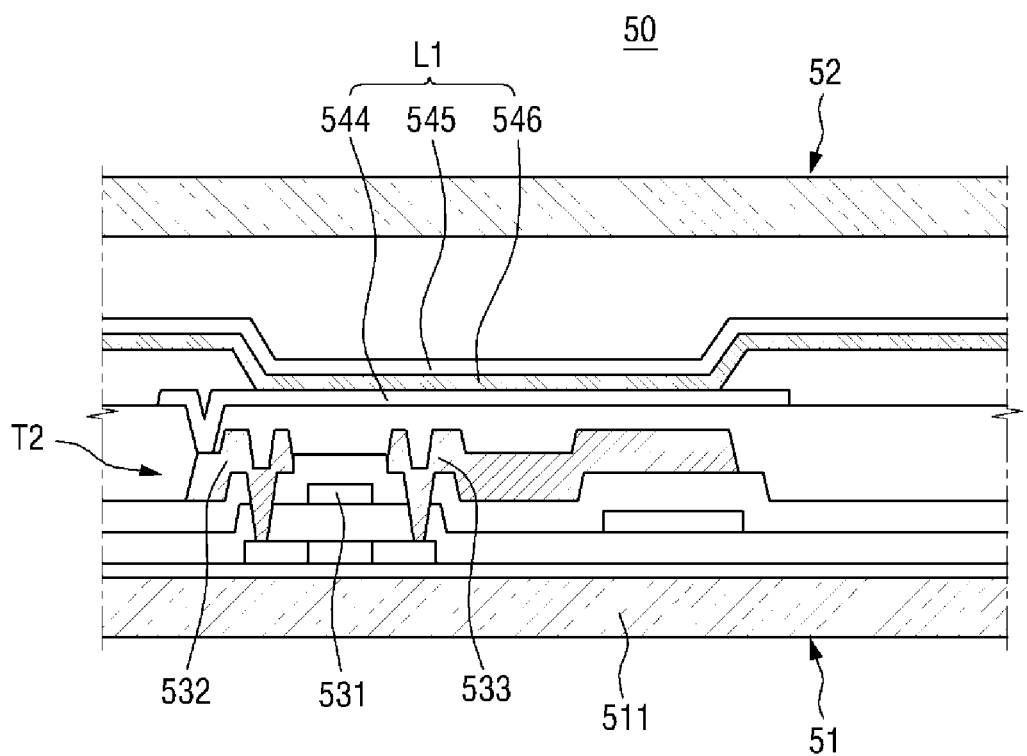
FIG. 4 is an enlarged partial cross-sectional view of a display panel assembly illustrated in FIG. 1.

The first substrate 51 may include pixels, which are arranged in the display area DA in the form of a matrix, as illustrated in FIG. 4. The first substrate 51 may also include a scan driver (not illustrated) and a data driver (not illustrated), which are disposed in the display area DA or the mounting area NA and drive the pixels. The first substrate 51 may also include pad electrodes (not illustrated), which are disposed in the mounting area NA.

The IC chip 40 may be mounted in the mounting area NA of the first substrate 51, and may be electrically connected to the pad electrodes. The first substrate 51 may also include interconnections (not illustrated), which connect the scan driver and the data driver.

The second substrate 52 may be bonded to the first substrate 51 and may seal and protect the pixels, the circuitry and the interconnections on the first substrate 51 from the outside thereof. The display panel assembly 50 may include a polarizing plate 58, which is attached onto a surface of the second substrate 52 and suppresses the reflection of external light, as illustrated in FIG. 3. The polarizing plate 58 may be optional.

Since the display panel assembly 50 is disposed near the driving circuit board 30, heat generated by the driving circuit board 30 may be transmitted to the display panel assembly 50, and may thus expedite the deterioration of a light-emitting layer (not illustrated) of the OLED display device 100. Heat generated by the display panel assembly 50 may also expedite the deterioration of the light-emitting layer of the OLED display device 100. The composite sheet 70, which performs heat-insulating and heat-dissipating operations, is provided in the gap between the bottom cover 80 where the driving circuit board 30 is provided. More specifically, the composite sheet 70 may be provided below the first substrate 51. The composite sheet 70 will be described later in detail with reference to FIGS. 5 to 11.

The bottom cover 80 may accommodate and support the driving circuit board 30 therein. The bottom cover 80 may be formed as a box having a flat bottom and sidewalls extended from the flat bottom. Even though not specifically illustrated in FIGS. 1 to 3, a bracket (not illustrated) may be disposed between the driving circuit board 30 and the bottom cover 80, and may be coupled to the bottom cover 80. The bracket may be another bottom cover for the display panel assembly 50, and may be a top cover for the bottom cover 80.

The bottom cover 80 may be formed in various manners using various materials. For example, the bottom cover 80 may be formed of a highly rigid material, i.e., a metal material such as stainless steel, cold rolled steel, aluminum, an aluminum alloy, a nickel alloy, magnesium, a magnesium alloy, or a plastic material. A metal plate or a plastic resin plate formed of such metal material or plastic material may be subjected to a well-known molding process such as deep drawing or bending, thereby forming the bottom cover 80 with a bottom and sidewalls.

The inner structure of the display panel assembly 50 will hereinafter be described with reference to FIG. 4.

The display panel assembly 50 may include multiple pixels, and may display an image. The pixels may generally be formed on the first substrate 51. Referring to FIG. 4, each of the pixels may include an organic light-emitting element L1 and a driving circuit.

The organic light-emitting element L1 may include an anode electrode 544, an organic light-emitting layer 545 and a cathode electrode 546.

The driving circuit may include a thin-film transistor T2. The driving circuit may also include a switching transistor (not illustrated) and at least one storage capacitor (not illustrated).

The switching transistor may be connected to a scan line (not illustrated) and a data line (not illustrated), and may transmit a data voltage applied thereto via the data line in accordance with an input switching voltage to the driving transistor T2.

The storage capacitor may be connected to the switching transistor and a power line (not illustrated), and may store a voltage corresponding to the difference between a voltage provided by the switching transistor and a voltage supplied to the power line.

The driving transistor T2 may include a source electrode 533, a drain electrode 532 and a gate electrode 531. The anode electrode 544 of the organic light-emitting element L1 may be connected to the drain electrode 532 of the driving transistor T2. The structure of the pixels, however, is not limited to that set forth herein, and may vary.

The second substrate 52 may cover the first substrate 51 where the organic light-emitting element L1 and the driving circuit are formed.

The composite sheet 70 will hereinafter be described in detail with reference to FIGS. 5 to 11.

Figure 5:
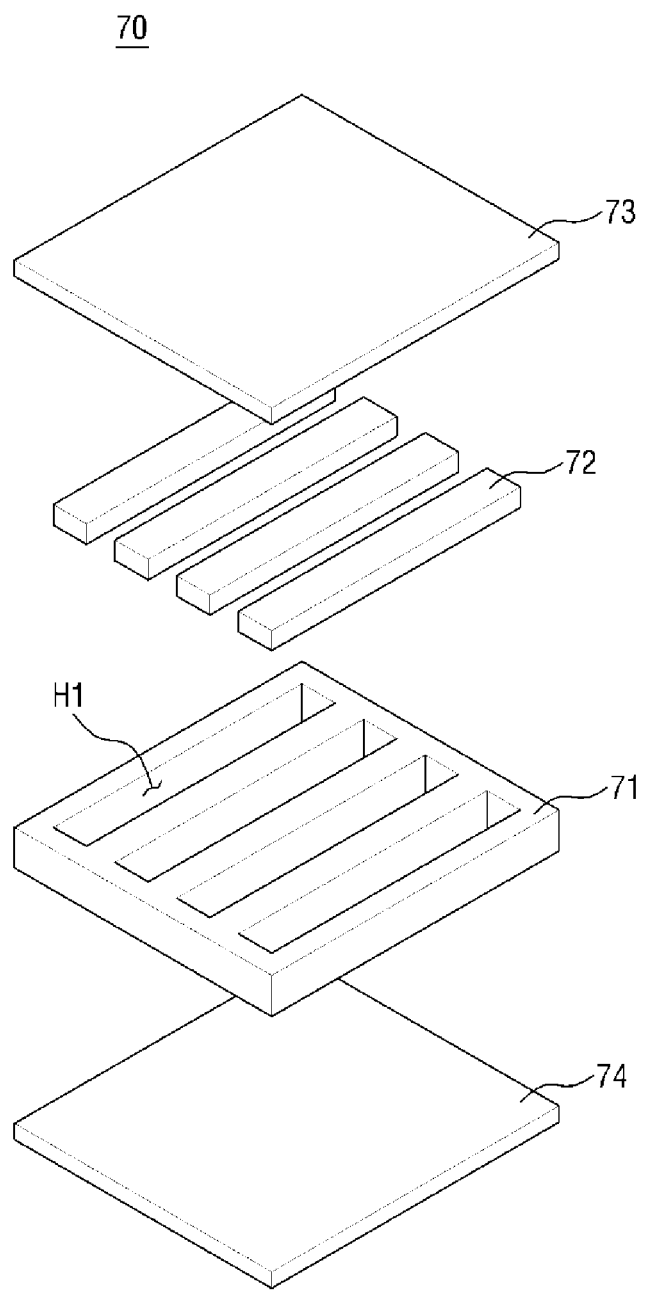
FIG. 5 is an exploded perspective view of a composite sheet according to a first exemplary embodiment of the invention.

FIG. 5 is an exploded perspective view of a composite sheet according to a first exemplary embodiment of the invention.

The composite sheet 70, which is disposed between the driving circuit board 30 and the display panel assembly 50, may perform a heat-insulating operation, i.e., may prevent heat generated by the driving circuit board 30 from being transmitted to the display panel assembly 50. The composite sheet 70 may perform a heat-dissipating operation, i.e., may dissipate heat generated by the display panel assembly 50 to the outside.

More specifically, referring to FIG. 5, the composite sheet 70 may include a buffer sheet 71, a plurality of first heat-dissipating sheets 72, a second heat-dissipating sheet 73, and a light-blocking sheet 74. For convenience, the composite sheet 70 is illustrated in FIG. 5 as including all the buffer sheet 71, the first heat-dissipating sheets 72, the second heat-dissipating sheet 73, and the light-blocking sheet 74. That is, in alternative exemplary embodiments, the composite sheet 70 may not include the second heat-dissipating sheet 73, i.e., may only include the buffer sheet 71, the first heat-dissipating sheets 72 and the light-blocking sheet 74.

The buffer sheet 71 may protect the display panel assembly 50 from external shock. That is, the buffer sheet 71 may absorb external shock applied thereto, and may improve the shock resistance of the display panel assembly 50.

The buffer sheet 71 may be formed of an elastic material. More specifically, the buffer sheet 71 may be formed of an elastic polymer resin. The buffer sheet 71 may be formed of a polyolefin-based resin such as a polyethylene (PE) resin or a polypropylene (PP) resin, a melamine resin, a phenol resin, an acrylic resin, a polyvinyl chloride (PVC) resin, a polyurethane (PU) resin, a polystyrene (PS) resin, or a polyvinyl acetate (PVA) resin.

More specifically, the buffer sheet 71 may be polymer foam. That is, the buffer sheet 71 may be a melamine foam, a phenol foam, an acrylic foam, a PVC foam, a PP foam, a PU foam, a urea foam, a PE foam, a PS foam, or a PVA foam.

A plurality of through holes H1 may be formed in the buffer sheet 71. The buffer sheet 71 is illustrated in FIG. 5 as having four through holes H1, but the invention is not limited thereto. The through holes H1 are illustrated in FIG. 5 as being rectangular, but the invention is not limited thereto. The through holes H1 may be arranged in parallel at regular intervals and may be isolated from one another. The through holes H1 may provide space for inserting and mounting the first heat-dissipating sheets 72 therein.

The first heat-dissipating sheets 72 may dissipate heat generated by the driving circuit board 30 to the outside. The first heat-dissipating sheets 72 may be formed in various shapes and may conform to the shapes of the through holes H1. For example, in response to the buffer sheet 71 including only one through hole H1, a single plate-type first heat-dissipating sheet 72 may be provided, conforming to the shape of the through hole H1.

More specifically, as illustrated in FIG. 5, the buffer sheet 71 may include four through holes H1, which are rectangular and are arranged in parallel, and four first heat-dissipating sheets 72, which are also rectangular and fill the four through holes H1. The first heat-dissipating sheets 72 may be arranged in parallel at regular intervals, may be isolated from one another, and may be disposed in the through holes H1, respectively. Obviously, in response to only one through hole H1 being provided in the buffer sheet 71, only one first heat-dissipating sheet 72 may be provided in the form of a plate.

Since the first heat-dissipating sheets 72 need to be inserted into the through holes H1, respectively, the first heat-dissipating sheets 72 may be formed to have a smaller volume than the through holes H1. That is, the length, width, and/or height of each first heat-dissipating sheets 72 may be relatively less than those of the corresponding through holes H1.

The first heat-dissipating sheets 72 may be formed of a material with excellent thermal conduction or diffusion properties. More specifically, the first heat-dissipating sheets 72 may be formed of a metal with excellent thermal conduction, such as silver, copper, a copper alloy, or aluminum, or a carbon-based material, such as graphite or graphene.

The second heat-dissipating sheet 73, like the first heat-dissipating sheets 72, may dissipate heat generated by the driving circuit board 30 to the outside. The second heat-dissipating sheet 73, unlike the first heat-dissipating sheets 72, is not inserted into the through is holes H1.

The second heat-dissipating sheet 73 may be mounted on the buffer sheet 71 and the first heat-dissipating sheets 72 inserted into the through holes H1 of the buffer sheet 71. The second heat-dissipating sheet 73 may be formed as a plate-type sheet, so as to increase the specific surface area thereof. The second heat-dissipating sheet 73 may quickly transmit or diffuse heat generated by the driving circuit board 30 to the outside.

The second heat-dissipating sheet 73 may face the driving circuit board 30. That is, the second heat-dissipating sheet 73 may be disposed relatively closer than the first heat-dissipating sheets 72 than to the driving circuit board 30.

Figure 7:
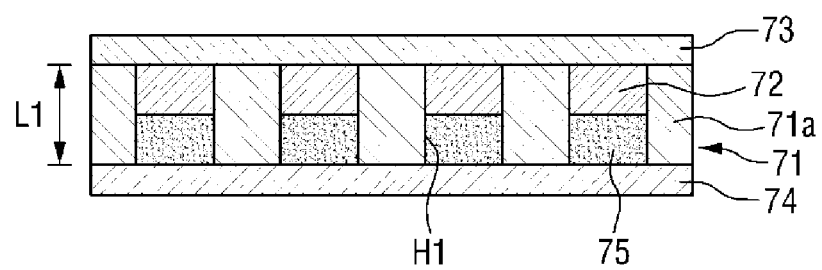
FIG. 7 is a cross-sectional view taken along line VII-VII' of FIG. 6.

In this case, the second heat-dissipating sheet 73 may transmit or diffuse some of the heat generated by the driving circuit board 30 to the outside, and then, the first heat-dissipating sheets 72 may transmit or diffuse the rest of the heat generated by the driving circuit board 30 to the outside. Referring to FIG. 7, the through holes H1 may be divided into a first region and a second region. The first heat-dissipating sheets 72 may be mounted in the first regions of the through holes H1, respectively, and a plurality of air layers 75 may be formed in the second regions of the through holes H1, respectively. The air layers 75 will be described later in detail and may be referred to as thermal insulation members.

The second heat-dissipating sheet 73, like the first heat-dissipating sheets 72, may be formed of a material with excellent thermal conduction or diffusion. More specifically, the second heat-dissipating sheet 73 may be formed of a metal with excellent thermal conduction, such as silver, copper, a copper alloy, or aluminum, or a carbon-based material, such as graphite or graphene.

The first heat-dissipating sheets 72 and the second heat-dissipating sheet 73 may be graphite sheets or metal sheets such as copper sheets.

The light-blocking sheet 74 may prevent light generated by the display panel assembly 50 from leaking, i.e., may absorb light. The light-blocking sheet 74 may be formed of nearly any types of light-blocking materials capable of preventing the leakage of light. For example, the light-blocking sheet 74 may be a black polymer film. The light-blocking sheet 74 may be mounted on an opposite surface of the buffer sheet 71 to the surface where the second heat-dissipating sheet 73 is mounted. Since the light-blocking sheet 74 is not inserted into the through holes H1 of the buffer sheet 71, the light-blocking sheet 74, like the second heat-dissipating sheet 73, may be formed as a plate-type sheet covering the buffer sheet 71. The light-blocking sheet 74 may have a patterned or roughened surface. For example, the light-blocking sheet may have a corrugated surface.

The second heat-dissipating sheet 73 may be disposed on the side of the driving circuit board 30, while the light-blocking sheet 74 may be disposed on the side of the display panel assembly 50. That is, the second heat-dissipating sheet 73 and the light-blocking sheet 74 may face each other with the buffer sheet 71 interposed therebetween.

The second heat-dissipating sheet 73 may directly contact the bottom cover 80. An adhesive material may be applied onto at least one of the top and bottom surfaces of the second heat-dissipating sheet 73. In a case in which a layer (not illustrated) of the adhesive material is formed on both the top and bottom surfaces of the second heat-dissipating sheet 73, the second heat-dissipating sheet 73 and the first heat-dissipating sheets 72 may be bonded together with the adhesive material layer interposed therebetween. In a case in which the adhesive material layer is formed on one of the top and bottom surfaces of the second heat-dissipating sheet 73, the second heat-dissipating sheet 73 and the bottom cover 80 may be bonded together with the adhesive material layer interposed therebetween.

The first heat-dissipating sheets 72 may be bonded to the second heat-dissipating sheet 73 by the adhesive material layer interposed therebetween.

The adhesive material layer may also be formed on both sides of each of the first heat-dissipating sheets 72. The first heat-dissipating sheets 72 may be bonded to the through holes H1, respectively, with the adhesive material layer interposed therebetween. In this case, the first heat-dissipating sheets 72 and the second heat-dissipating sheets 73 may directly contact each other.

Alternatively, the adhesive material layer may be formed on the sidewalls of each of the through holes H1, instead of the sides of each of the first heat-dissipating sheets 72.

The adhesive material layer may also be formed on at least one of the top and bottom surfaces of the light-blocking film 74. The buffer sheet 71 and the first substrate 51 may be bonded onto the top and bottom surfaces, respectively, of the light-blocking film 74.

An adhesive polymer resin, such as a silicon-based, an acryl-based or a urethane-based resin, may be used as the adhesive material. More specifically, an acryl-based resin may be used as the adhesive material.

Figure 6:
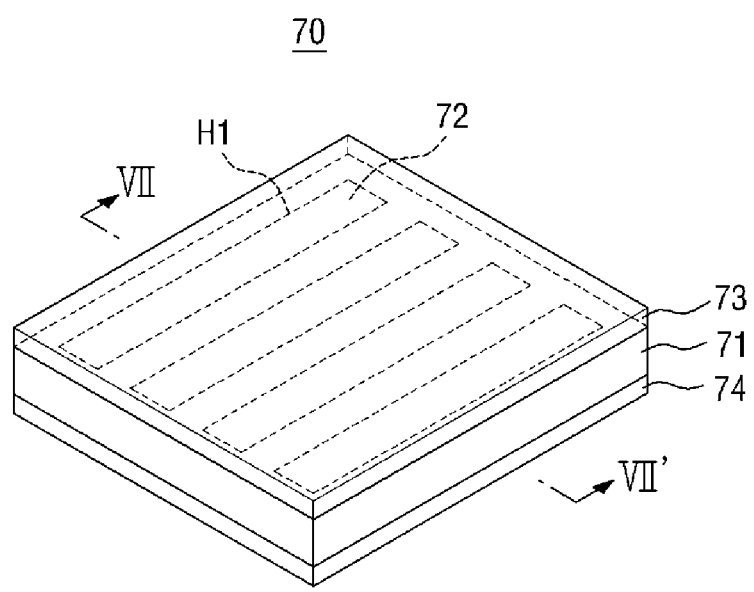
FIG. 6 is an assembled perspective view of the composite sheet illustrated in FIG. 5.

FIG. 6 is an assembled perspective view of the composite sheet illustrated in FIG. 5, and FIG. 7 is a cross-sectional view taken along line VII-VII' of FIG. 6.

Referring to FIGS. 6 and 7, four first heat-dissipating sheets 72, which are formed as cuboids, are inserted, and mounted, in four through holes H1, respectively, which are arranged in parallel and are isolated from each other, and the light-blocking sheet 74 and the second heat-dissipating sheet 73 may be disposed on both surfaces, respectively, of the buffer sheet 71.

As illustrated in FIG. 7, the first heat-dissipating sheets 72 may contact the second heat-dissipating sheet 73. More specifically, as described above, an adhesive material layer may be formed on both sides of each of the first heat-dissipating sheets 72 or on the sidewalls of each of the through holes H1, and the first heat-dissipating sheets 72 and the second heat-dissipating sheet 73 may directly contact each other.

The buffer sheet 71 may have a cross-sectional shape in which four elastic members 71a are periodically arranged with the through holes H1 provided therebetween. The space inside each of the through holes H1 may be divided into a first region and a second region. The first heat-dissipating sheets 72 may be arranged in the first regions of the through holes H1, respectively, and the air layers 75 may be provided in the second regions of the through holes H1, respectively.

More specifically, the first regions may be places where the first heat-dissipating sheets 72 are disposed in the through holes H1, respectively, such that the top surfaces of the first heat-dissipating sheets 72 are level with the top surface of the buffer sheet 71, and the rest of the space in each of the through holes H1 may be the second regions.

In response to the buffer sheet 71 having a thickness L1, the thickness of the first heat-dissipating sheets 72 may be less than half the thickness L1. More specifically, the thickness of the first heat-dissipating sheets 72 may be less than 50% of the depth of the through holes H1 or the thickness of the buffer sheet 71.

In a case in which the first regions and the second regions differ from each other only in height, the volume of the first regions may be less than the volume of the second regions, and the height of the first regions may be less than the height of the second regions. The height of the second regions may be 50% or more of the thickness of the buffer sheet 71.

The air layers 75 may perform a thermal insulation operation by preventing heat generated by the driving circuit board 30 from being introduced into the display panel assembly 50. Heat generated by the driving circuit board 30 may collide with the air layers 75 in the through holes H1, and thus, may be transmitted or diffused to the outside via the first heat-dissipating sheets 72 or the second heat-dissipating sheet 73.

The air layers 75 not only can prevent a thermal amplification phenomenon by insulating heat generated by the display panel assembly 50 and heat generated by the driving circuit board 30 from each other, but also can help dissipate the heat generated by the driving circuit board to the outside.

The light-blocking sheet 74 may be an embossed sheet. That is, an embossed pattern may be formed on the surface of the black polymer film of the light-blocking sheet 74, and a plurality of air layers in the embossed pattern, like the air layers 75 in each of the through holes H1, may perform a thermal insulation function.

Figure 8:
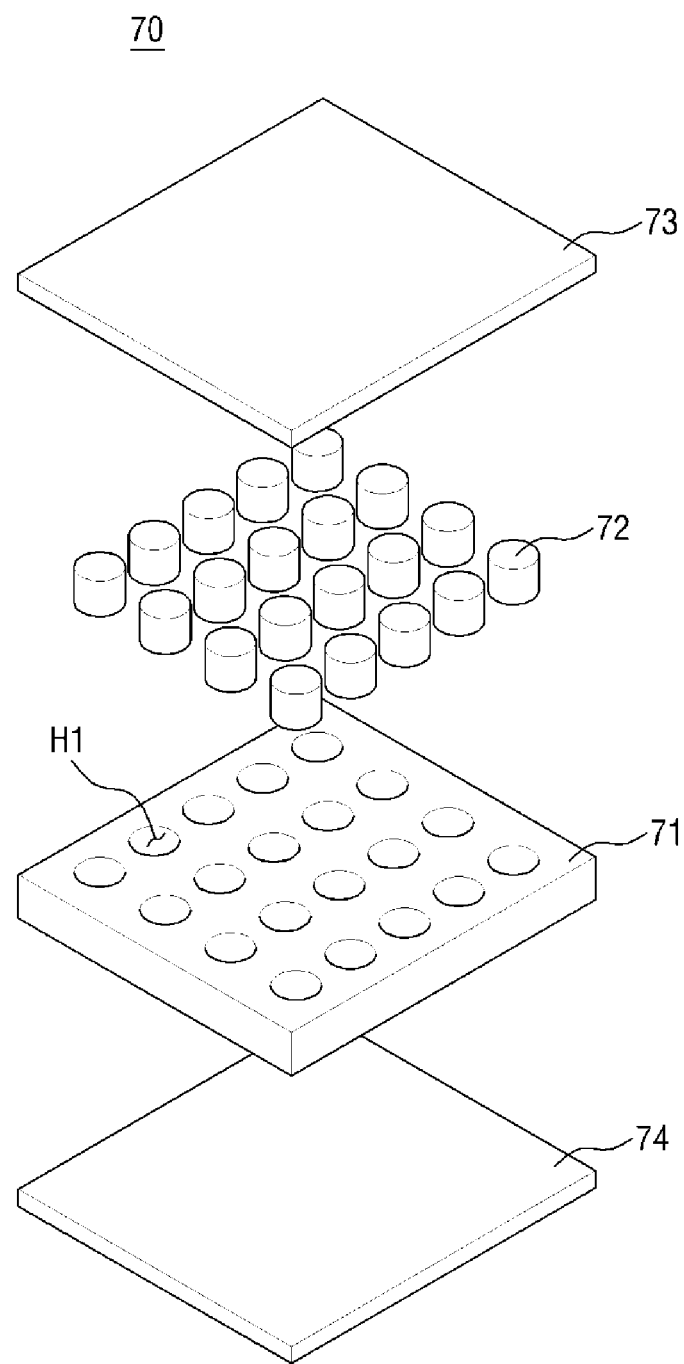
FIG. 8 is an exploded perspective view of a composite sheet according to a second exemplary embodiment of the invention.

FIG. 8 is an exploded perspective view of a composite sheet 70 according to another exemplary embodiment of the invention. The composite sheet 70 of FIG. 8 differs from the composite sheet 70 of FIG. 5 in that in the composite sheet 70 includes through holes H1 are arranged in a cylindrical island pattern, whereas the through holes H1 of FIG. 5 are arranged in a cuboid stripe pattern. The composite sheet 70 of FIG. 8 also differs from the composite sheet 70 of FIG. 5 in that in the composite sheet 70 of FIG. 8, a plurality of first heat-dissipating sheets 72 are arranged in the cylindrical island pattern, conforming to the shape of the through holes H1, whereas the first heat-dissipating sheets 72 of FIG. 5 are arranged in the rectangular stripe pattern.

Figure 9:
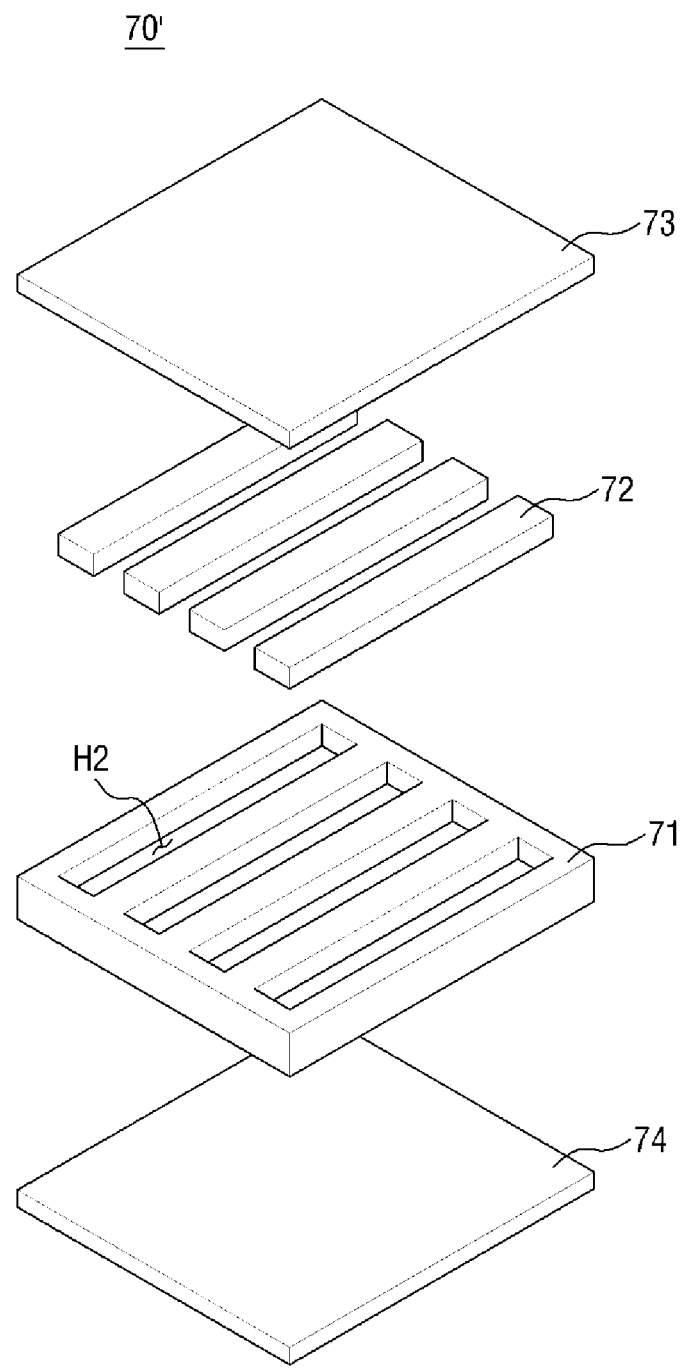
FIG. 9 is an exploded perspective view of a composite sheet according to a third exemplary embodiment of the invention.

FIG. 9 is an exploded perspective view of a composite sheet 70' according to another exemplary embodiment of the invention. A composite sheet 70' of FIG. 9 differs from the composite sheet 70 of FIG. 5 in that in the composite sheet 70', a plurality of grooves H2, instead of a plurality of through holes H1, are formed on a buffer sheet 71.

Figure 10:
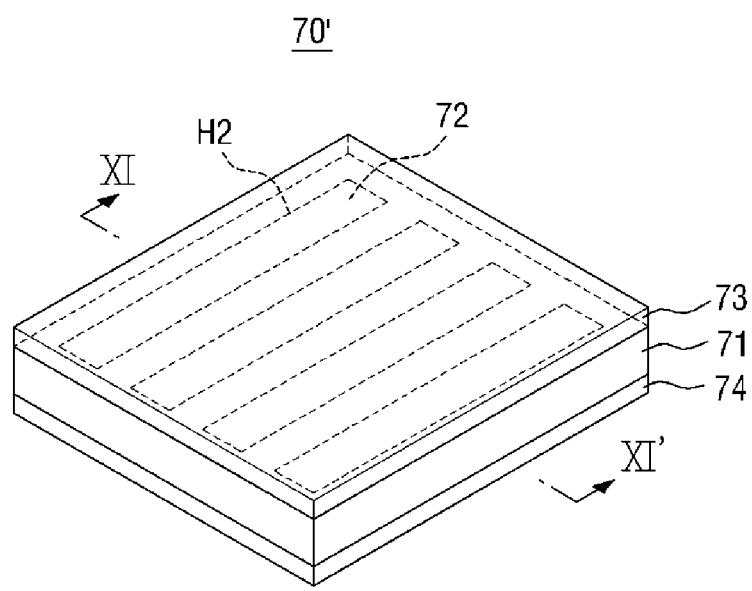
FIG. 10 is an assembled perspective view of the composite sheet illustrated in FIG. 9.
Figure 11:
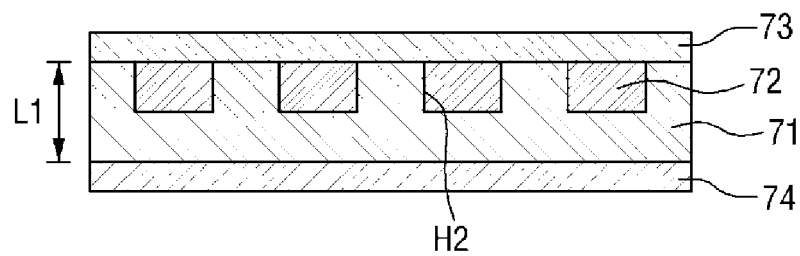
FIG. 11 is a cross-sectional view taken along line XI-XI' of FIG. 10.

FIG. 10 is an assembled perspective view of the composite sheet illustrated in FIG. 9, and FIG. 11 is a cross-sectional view taken along line XI-XI' of FIG. 10.

The grooves H2 of the composite sheet 70' of FIG. 9 will hereinafter be described in detail with reference to FIGS. 10 and 11. Referring to FIG. 11, an embossed structure including a plurality of recesses and a plurality of protrusions may be formed on one surface of a buffer sheet 71, and the recesses of the embossed structure may serve as the grooves H2 in which first heat-dissipating sheets 72 are disposed. When inserted and mounted in the grooves H2, the first heat-dissipating sheets 72 may contact a second heat-dissipating sheet 73. The grooves H2 may be formed such that the depth of the grooves H2 may be less than 50% of a thickness L1 of the buffer sheet 71. Accordingly, no air layers are formed in the composite sheet 70', unlike in the composite sheet 70 of FIG. 5.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A display device, comprising:
   a display panel;
   a bottom cover configured to accommodate the display panel; and
   a composite sheet disposed between the display panel and the bottom cover and comprising:
   a buffer sheet comprising a through hole; and
   a heat-dissipating sheet disposed in the through hole,
   wherein the heat-dissipating sheet is disposed in a first region of the through hole and an air layer is disposed in a second region of the through hole.

2. The display device of claim 1, wherein a thickness of the heat-dissipating sheet is less than 50% of a depth of the through hole.

3. The display device of claim 2, wherein the composite sheet further comprises a metal sheet directly contacting the buffer sheet and the heat-dissipating sheet.

4. The display device of claim 1, wherein the buffer sheet comprises an elastic polymer sheet.

5. The display device of claim 1, wherein the heat-dissipating sheet comprises a graphite sheet or a graphene sheet.

6. The display device of claim 3, wherein the metal sheet comprises a copper sheet.

7. The display device of claim 1, further comprising a driving circuit board disposed between the bottom cover and the composite sheet and configured to drive the display panel.

8. A composite sheet, comprising:
   a buffer sheet comprising a plurality of through holes in an elastic material; and
   heat-dissipating members disposed in each through hole,
   wherein each heat-dissipating member is disposed in a first region of each through hole and an air layer is disposed in a second region of each through hole.

9. The composite sheet of claim 8, further comprising a metal plate deposited on the buffer sheet.

10. The composite sheet of claim 9, wherein the metal plate covers a surface of the composite sheet and directly contacts the buffer sheet and the heat-dissipating members.

11. The composite sheet of claim 8, wherein a thickness of the heat-dissipating members is less than 50% of a thickness of the buffer sheet.

12. The composite sheet of claim 8, wherein the elastic material is a foam polymer.

13. The composite sheet of claim 8, wherein the heat-dissipating members comprise graphite or graphene.

14. The composite sheet of claim 9, wherein the metal plate comprises copper.

15. A composite sheet, comprising:
   a buffer sheet formed of polymer foam and comprising a plurality of grooves formed on a top surface thereof; and
   a heat-dissipating sheet disposed in each of the plurality of grooves such that a top surface of each heat-dissipating sheet is on a level with the top surface of the buffer sheet.

16. The composite sheet of claim 15, wherein a thickness of each heat-dissipating sheet is less than 50% of a thickness of the buffer sheet.

17. The composite sheet of claim 15, wherein the plurality of grooves are parallel.

* * * * *